United States Patent [19]
Leduc

[11] Patent Number: 5,841,386
[45] Date of Patent: Nov. 24, 1998

[54] SIMPLE HIGH RESOLUTION MONOLITHIC DAC FOR THE TUNING OF AN EXTERNAL VCXO (VOLTAGE CONTROLLED QUARTZ OSCILLATOR)

[75] Inventor: Yves Leduc, Roquefort-Les-Pins, France

[73] Assignee: Texas Instruments Incorporated, Dallas, Tex.

[21] Appl. No.: 786,524

[22] Filed: Jan. 21, 1997

[30] Foreign Application Priority Data

Jan. 18, 1996 [FR] France ................................. 96 00548

[51] Int. Cl.$^6$ ...................................................... H03M 3/02
[52] U.S. Cl. ............................................ 341/143; 341/144
[58] Field of Search ..................................... 341/143, 144

[56] References Cited

U.S. PATENT DOCUMENTS 5,323,157   6/1994   Ledzius et al. .......................... 341/143

OTHER PUBLICATIONS

Louis A. Williams, Third–Order Cascaded Sigma–Delta Modulators, IEEE Transactions on Circuits and Systems, vol. 38, No. 5, pp. 489–498, May 1991.

*Primary Examiner*—Marc S. Hoff
*Assistant Examiner*—Peguy JeanPierre
*Attorney, Agent, or Firm*—Gerald E. Laws; William B. Kempler; Richard L. Donaldson

[57] ABSTRACT

This invention relates to a high-resolution digital/analogue converter intended in particular for the tuning of a voltage-controlled quartz oscillator. This converter comprises a first second-order Sigma-Delta modulator (1) to the output of which is connected the input of a second Sigma-Delta modulator (9) producing a single bit at its output and a digital/analogue conversion circuit (13). The circuit of the converter furthermore comprises means for filtering the high-frequency components of the signal undergoing processing so as to obtain a quasi-stable D.C. voltage source with a high resolution.

This invention is applicable to any voltage-controlled system having large inertia, and in particular, voltage-controlled quartz oscillators and transducers.

13 Claims, 2 Drawing Sheets

SIMPLE HIGH RESOLUTION MONOLITHIC DAC FOR THE TUNING OF AN EXTERNAL VCXO (VOLTAGE CONTROLLED QUARTZ OSCILLATOR)

BACKGROUNG OF THE INVENTION

The present invention relates to a high-resolution digital/analogue converter intended in particular for the tuning of a voltage-controlled quartz oscillator.

The tuning of voltage-controlled quartz oscillators of imprecise frequency requires a high-resolution (ten or more bits) digital/analogue converter.

The assets recommended for such a converter are a low cost, low energy consumption, good robustness of construction, a wide dynamic range and good output stability.

Sigma-Delta converters for constructing straight-forward high-resolution digital/analogue converters are known. A Sigma-Delta digital modulator yields a high-speed sequence of digital words (one bit or a few bits wide) which controls a high-speed but straightforward digital/analogue converter. Analogue filtering is required to reconstruct the analogue signal while suppressing the high-frequency noise.

This analogue filtering is the greatest weakness of the known devices since Sigma-Delta modulators produce several unwanted characteristics depending on their configuration and on the order of their modulation.

First-order modulators produce a number of parasitic oscillations (called TONES) depending on the input signal to be coded and which are difficult to filter since they can occur at very low frequencies. The essential assets of these first-order modulators are however their simplicity, an output one bit wide and therefore make it possible to realize converters having inherent linearity over the complete input range.

Second-order modulators (series configuration) exhibit a lesser but still significant content of parasitic oscillations. Furthermore, they exhibit significant straying of the signal/noise ratio for the highest codes.

Second-order modulators (parallel configuration) exhibit a much smaller but still significant content of parasitic oscillations. They deliver digital words with several bits, which means that it is no longer possible to guarantee good linearity without a digital/analogue converter with high-quality output. On the other hand, they do not exhibit the straying of the signal/noise ratio of the series configuration.

Higher-order modulators (series configuration) have superior assets but they produce more high-frequency noise, thus requiring more complex analogue filtering. A parallel configuration represents a better solution, but it also produces words with several bits and therefore requires a digital-analogue converter with highly linear output.

SUMMARY OF THE INVENTION

The present invention aims to alleviate these drawbacks by proposing a straightforward digital/analogue converter based on Sigma-Delta modulators and a straight-forward digital/analogue conversion circuit which has a quasi-stable D.C. current output with high resolution.

For this purpose, the subject of the invention is a high-resolution digital/analogue converter intended for the tuning in particular of a voltage-controlled quasi-stable oscillator, characterized in that it comprises a first second-order Sigma-Delta modulator intended to receive at its input digital signals to be converted, to the output of which is connected the input of a second Sigma-Delta modulator producing a single bit at its output and in that it comprises a digital/analogue conversion circuit arranged downstream of the Sigma-Delta modulators and with which are associated means for filtering the high-frequency components of the signal undergoing processing so as to obtain a high-resolution quasi-stable D.C. current source for the said oscillator.

BRIEF DESCRIPTION OF THE DRAWINGS

Other characteristics and advantages of the invention will emerge from the following description given by way of non-limiting example, in conjunction with the appended drawings in which.

DESCRIPTION OF THE PREFERRED EMBODIMENTS

Figure 1:
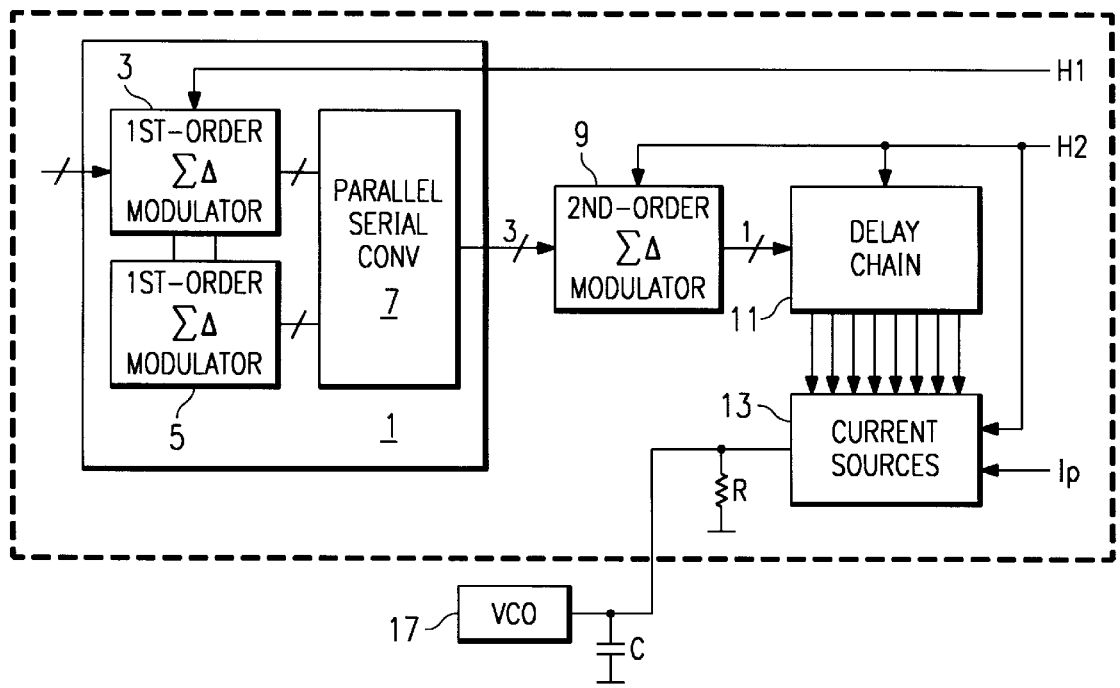
FIG. 1 is an electrical diagram of a high-resolution digital/analogue converter according to the invention.

The high-resolution digital/analogue converter according to the invention represented in FIG. 1 comprises a first second-order Sigma-Delta modulator 1 clocked by a first clock signal H1 and which receives at its input a digital word-of n bits, n being an integer. Advantageously, this first Sigma-Delta modulator 1 is formed of two first-order Sigma-Delta modulators 3 and 5 connected together in a parallel configuration, the output of each being connected to an input of a parallel/series converter 7. This first Sigma-Delta modulator 1 thus constructed outputs high-speed sequences of digital words of three bits.

The input of a second first-order Sigma-Delta. modulator 9 is linked to the output of the first Sigma-Delta modulator 1. This second Sigma-Delta modulator 9 is clocked by a second clock signal H2 preferably having a frequency substantially higher than that of the first clock signal H1. For example, the clock signal H1 has a frequency of 1 MHz whereas the clock signal H2 has a frequency of 2 Mz.

Figure 2:
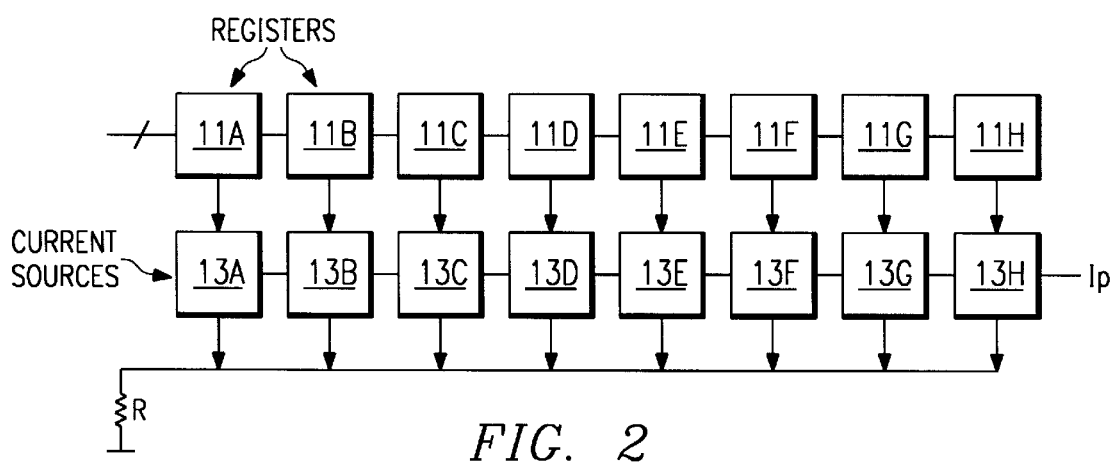
FIG. 2 is a more detailed electrical diagram of a part of the high-resolution digital/analogue converter of FIG. 1.

The output of the second Sigma-Delta modulator 9 delivers a signal one bit wide at the frequency of the clock H2. This output is connected to a serial input/-parallel output digital delay chain 11 comprising, as represented in FIG. 2, registers 11A to 11H The output of each register 11A to 11H of the digital delay chain 11 respectively controls a corresponding current source of a set 13 of separate current sources 13A to 13H. The separate current sources 13A to 13H are fed with a bias current $I_P$. The digital delay chain 11 as well as the set 13 of current sources are clocked by the second clock $H_2$.

In a circuit variant, not represented, the output of the second Sigma-Delta modulator is connected directly to the input of a digital analogue conversion circuit consisting for example of a single current source which corresponds to the abovementioned set 13 of current sources. The output of this single current source is connected to a resistor corresponding to the resistor R of FIGS. 1 and 2.

This set of delays and of current sources realizes as known per se a finite-response low-pass filter. The number of delays and the value of each source can be usefully adapted to carry out low-pass filtering functions adapted to the desired application.

The set of outputs of the current sources 13A to 13H is connected to a summing resistor R and the latter is linked to a given potential, for example to earth.

The whole of the circuit described hitherto and enclosed in FIG. 1 within a dashed line can be realized monolithically.

A capacitor C is connected in parallel with the resistor R and together with the latter constitutes an RC filtering circuit. Finally, a voltage-controlled quartz oscillator 17 is controlled by the voltage of the RC circuit.

The operation of the -circuit will now be described. In this description, each step of the operation of the circuit described above is moreover illustrated by one of FIGS. 3A to 3D, each showing a graph on logarithmic scales which charts as a solid line the amplitude of the signal at various locations in the circuit as a function of frequency. For comparative purposes, the function represented in FIG. 3A is reproduced as a chain-dotted line in FIGS. 3B to 3D.

The invention consists in using a cascade of Sigma-Delta modulators so as to produce from an n-bit input a single-bit output-without parasitic oscillations, whilst providing for a straightforward realization of analogue filterings.

A first step uses the second-order Sigma-Delta digital modulator 1 to produce from an n-bit digital word a high-speed sequence of three-bit digital words.

Figure 3A:
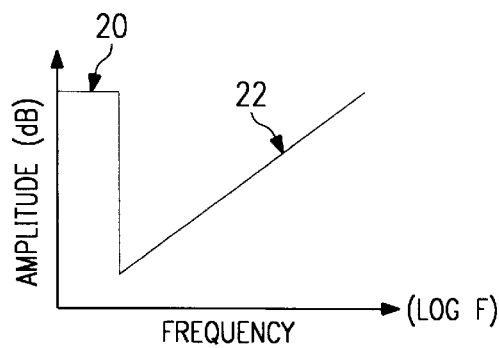
FIGS. 3A, 3B, 3C and 3D are graphs showing the amplitude of the input signal to the converter according to the invention as a function of the frequency at various locations in the electrical circuit of FIG. 1.

FIG. 3A shows the graph of the amplitude of the output signal from this first Sigma-Delta digital modulator as a function of frequency. In this graph may be distinguished a plateau 20 situated in the low-frequency region and resulting from the processing of the input signal by the first modulator 1. In the higher-frequency region may be seen a straight line 22 having a positive slope which corresponds to the quantization noise characteristic of Sigma-Delta modulators. It is observed that the amplitude of the quantization noise at the highest frequencies attains the same level as the amplitude of the plateau 20. Despite its relatively large content of high-frequency quantization noise, the output from the first modulator 1 exhibits very few and very small parasitic oscillations.

During the second step, the output signal from this first stage is applied to the input of the second first-order Sigma-Delta modulator 9 and is coded by the latter The output from the second modulator has a width of one bit and high frequency. The elevated level of the high-frequency noise at the input of the second modulator 9 gives rise usefully at its output to the spreading of the parasitic oscillations normally produced by this modulator.

Figure 3B:
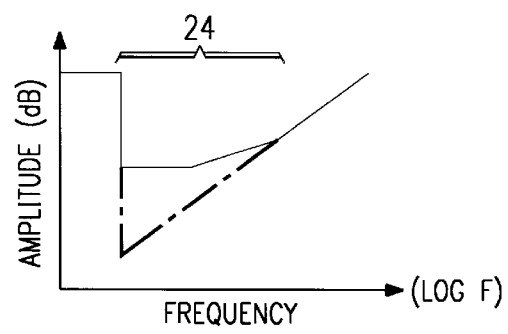
Figure 3C:
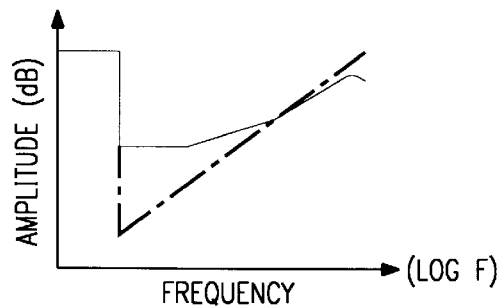

As illustrated in FIG. 3B, this has the effect of reducing the signal/noise ratio in the intermediate-frequency region 24. Nevertheless, a high-frequency signal one bit wide and little affected by parasitic oscillations is obtained at the output of this cascade of Sigma-Delta modulators 1 and 9, subsequently allowing the use of a straightforward digital/analogue conversion circuit based on a set of separate current sources and a summing resistor such as described with reference to FIGS. 1 and 2. Moreover, such- a digital/analogue conversion circuit has the advantage of a high-impedance output thus reducing the consumption of energy by the circuit.

The digital delay chain 11 interposed between the second Sigma-Delta modulator 9 and the set 13 of current sources, constitutes in combination with this set 13 a first filter for smoothing the high-frequency noise. As may be noted in FIG. 3C, the positive slope of the high-frequency quantization noise is reduced by such an arrangement.

Figure 3D:
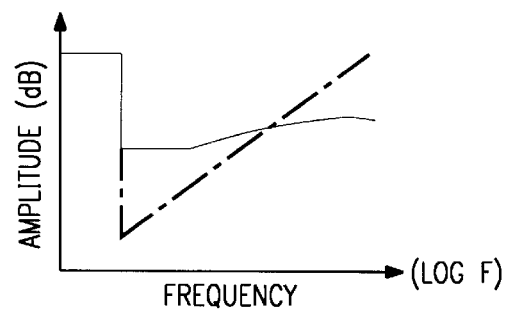

The capacitor C forms together with the resistor R of the circuit, a second low-pass filter which is all the more effective the greater the resistance of R. The action of the low-pass filter thus realized is illustrated in FIG. 3D. The positive slope and consequently the quantization noise in the high-frequency region are almost entirely suppressed. The residual high-frequency noise remains markedly less than the amplitude of the useful signal.

Filtering of the high-frequency noise is further improved through the fact that the quartz itself of the oscillator 17 controlled by the voltage of the RC circuit constitutes a third low-pass filter by virtue of its high Q factor. The stability of the quartz is unaffected by the residual noise at the output of the converter according to the invention.

The combination of the three filters comprising the digital delay chain 11 combined with the set 13 of current sources, the circuit RC and the filter consisting of the quartz of the oscillator 17, ensures very effective low-pass filtering.

Figure 4:
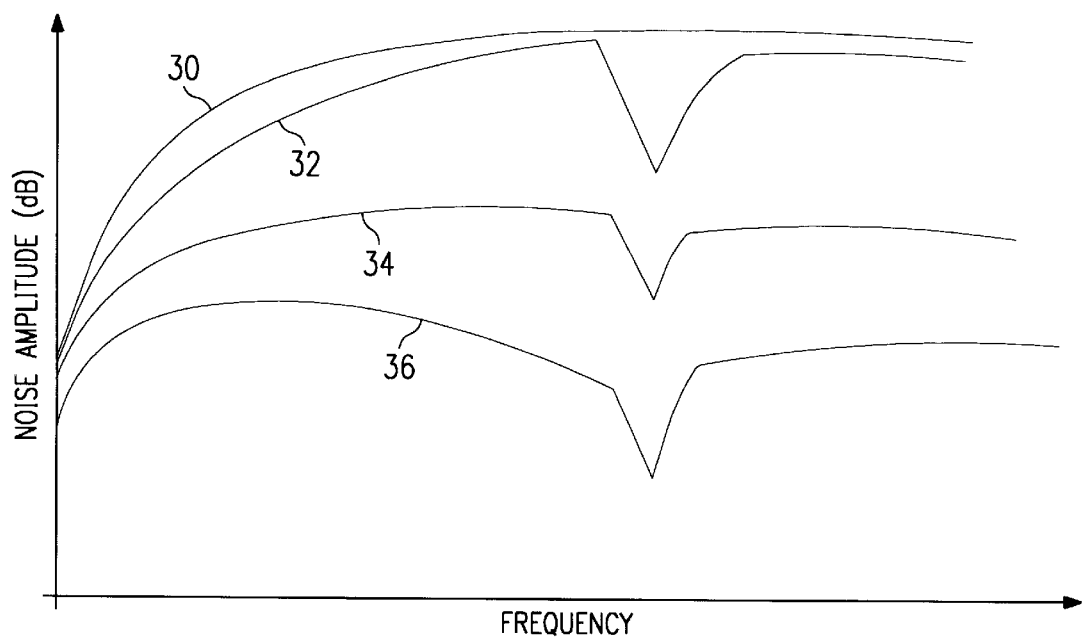
FIG. 4 is a graph showing noise spectra as a function of frequency at various locations in the electrical circuit of FIG. 1.

FIG. 4 shows diagrammatically four noise spectra 30, 32, 34 and 36.

The spectrum 30 represents the noise at the output of the Sigma-Delta modulators 1 and 9, the spectrum 32, after the set 13 of current sources, the spectrum 34, after the RC circuit and the spectrum 36, after the quartz of the oscillator 17. It is observed that after each filtering step, the noise level decreases significantly.

The advantages of the circuit thus realized are as follows:

The filtering means are virtually complete insofar as they require only one external component formed by the capacitor C, and a digital delay chain in the integrated circuits. The multiple current sources represent a very small extra cost price owing to the fact that a single large current source is replaced by several smaller sources.

Energy consumption is low since the first second-order Sigma-Delta modulator which is the more complex, operates at a lower frequency than the second. Furthermore, the current source controls a resistor of high value.

The design is robust and no frail item is used. The analogue filtering does not require perfect matching of the separate current sources: the filtering is slightly affected as a result, but not the linearity of the converter.

The analogue output requires no complex cell as for example an operational amplifier.

The digital/analogue converter according to the invention applies to any voltage-controlled system having large inertia. Apart from voltage-controlled quartz oscillators, the converter can also be used to control, for example, a ceramic-based, electromechanical or other transducer.

I claim:

1. A high-resolution digital/analogue converter, comprising:

a first second-order Sigma-Delta modulator (1) connected in paralled with an input for receiving a first sequence of digital words to be converted, and with a first modulated signal output for providing a second sequence of digital words at a first rate responsive to a first clock signal;

a second Sigma-Delta modulator (9) with an input connected to the first modulated signal output, and with a second modulated signal output for providing a third sequence of digital words at a second rate responsive to a second clock signal; and a digital/analog conversion circuit (11, 13) with an input directly connected only to the second modulated signal output, and with an analog signal output for providing a high-resolution quasi-stable D.C. voltage source.

2. The converter of claim 1, wherein the first second-order Sigma-Delta modulator (1) further comprises two first-order Sigma-Delta modulators (3,5) connected in parallel, the output of each modulator being connected to an input of a parallel/series converter (7).

3. The converter of claim 2, wherein the second Sigma-Delta modulator (9) is a first-order Sigma-Delta modulator.

4. The converter of claim 3, wherein the second clock signal has a substantially higher frequency than the first clock signal.

5. The converter of claims 1, wherein the digital/analog conversion circuit further comprises a current source whose input is linked to the output of the second modulator (9), an output of the current source being connected to a resistor (R).

6. The converter of claim 5, further comprising a capacitor (C) connected in parallel with the resistor (R) so as to constitute a low-pass filter.

7. The converter of claim 6, further comprising a digital delay chain (11) interposed between the second Sigma-Delta modulator (9) and a set (13) of separate current sources (13A to 13H) constituting the current source, the outputs of the current sources (13A to 13H) being connected to the resistor (R) which constitutes a summing resistor, the combination of the digital delay chain (11) and of the set (13) of current sources constituting a filter for smoothing very high frequency noise.

8. The converter of claim 7, wherein the circuit comprising the first second-order Sigma-Delta modulator (1), the second first-order Sigma-Delta modulator (9), the digital delay chain (11), the set (13) of current sources and the summing resistor (R), is. a monolithic circuit.

9. The converter of claim 1, wherein the first clock signal has a frequency of one megahertz and the second clock signal has a frequency of two megahertz.

10. The converter of claim 1, wherein the first modulated signal output provides the second sequence of digital words such that each digital word is three bits.

11. The converter of claim 1, wherein the second modulated signal output provides the third sequence of digital words such that each digital word is one bit.

12. A voltage controlled oscillator circuit, comprising:

a high-resolution digital/analog converter with an input for receiving a digital word and an output for providing a filtered control signal;

a voltage-controlled quasi-stable oscillator (17) with a control input connected to the output of the high-resolution digital/analog converter; and wherein the high-resolution digital/analog converter further comprises:

a first second-order Sigma-Delta modulator (1) connected in paralled with an input for receiving a first sequence of digital words to be converted, and with a first modulated signal output for providing a second sequence of digital words at a first rate responsive to a first clock signal;

a second Sigma-Delta modulator (9) with an input connected to the first modulated signal output, and with a second modulated signal output for providing a third sequence of digital words at a second rate responsive to a second clock signal; and a digital/analog conversion circuit (11, 13) with an input directly connected only to the second modulated signal output, and with an analog signal output for providing a high-resolution quasi-stable D.C. voltage source.

13. The voltage controlled oscillator circuit of claim 12, wherein a stable-frequency component of the oscillator itself constitutes a low-pass filter by virtue of its (Q) factor.

* * * * *